United States Patent [19]

Lu

[11] Patent Number: 6,067,231
[45] Date of Patent: May 23, 2000

[54] HEAT-DISSIPATING STRUCTURE FOR AN ELECTRICAL DEVICE

[75] Inventor: Jih-Yung Lu, SanChung, Taiwan

[73] Assignee: Acer Peripherals, Inc., Kweishan, Taiwan

[21] Appl. No.: 09/285,642

[22] Filed: Apr. 5, 1999

[30] Foreign Application Priority Data

Nov. 10, 1998 [TW] Taiwan ................................ 87218604

[51] Int. Cl.[7] .................................................. H05K 7/20
[52] U.S. Cl. .................. 361/704; 361/707; 361/709; 361/712; 361/717; 361/718; 361/719; 257/706; 257/713; 257/721; 174/16.3; 165/80.2; 165/185
[58] Field of Search ..................... 361/688, 690, 361/702–704, 707, 709, 712, 717–721; 257/706, 719, 721; 174/15.1, 16.1, 16.3; 165/80.2, 80.3

[56] References Cited

U.S. PATENT DOCUMENTS

| | | | |
|---|---|---|---|
| 5,262,922 | 11/1993 | Yamaji et al. | 361/720 |
| 5,459,639 | 10/1995 | Izumi | 361/707 |
| 5,459,640 | 10/1995 | Moutrie et al. | 361/707 |
| 5,467,251 | 11/1995 | Katchmar | 361/719 |
| 5,617,294 | 4/1997 | Watson et al. | 361/719 |
| 5,659,458 | 8/1997 | Patchen | 361/704 |
| 5,708,566 | 1/1998 | Hunninghaus et al. | 361/764 |
| 5,729,432 | 3/1998 | Shim et al. | 361/690 |
| 5,825,625 | 10/1998 | Esterberg et al. | 361/719 |
| 5,920,458 | 7/1999 | Azar | 361/704 |

*Primary Examiner*—Leon P. Picard
*Assistant Examiner*—Boris Chervinsky
*Attorney, Agent, or Firm*—Dougherty & Troxell

[57] ABSTRACT

A heat-dissipating structure for an electrical device comprises a PC board with a dissipating opening, and an electrical device. The PC board has an upper surface thereof and a lower surface thereof located opposite to the upper surface. The electrical device has a plurality of leads thereof extruding from a bottom surface thereof for anchoring the electrical device on the upper surface of the PC board with a substantial spacing in between. The dissipating opening is located under the electrical device for providing an air convection space to dissipate the heat generated by the electrical device. Also, dissipating plates can be installed above or under the PC board for enhancing the heat-dissipating efficiency.

7 Claims, 6 Drawing Sheets

HEAT-DISSIPATING STRUCTURE FOR AN ELECTRICAL DEVICE

BACKGROUND OF THE INVENTION (1) Field of the Invention

The invention relates to a structure to dissipate heat generated by an electrical device, and more particularly to a structure dissipating the heat generated by the electrical device by a dissipating opening provided on a PC board located under the electrical device.

(2) Description of the Prior Art

In application of electrical wares, the heat-dissipation is always a crucial and essential problem. Especially for the electrical devices, a good heat dissipating mechanism usually guarantees a stable performance of an electrical device. On the contrary, an electrical device operated under an ill-dissipating condition will inevitably lead to an unstable performance and reduce its operation life.

A fan mechanism for generating forced airflow and dissipating fins for diffusing heat are usually seen in conventional heat dissipating system. In the fan mechanism, airflow is generated by the fan to rapidly take away the heat generated by any electrical devices in the nearby area. On the other hand, the fin structure 3 as typically shown in FIG. 1 is usually mounted on the top surface of a target electrical device 2 of a PC board 1 to diffuse the heat generated by the electrical device 2.

However, for some types of electrical devices, the top surface is designed for a specific purpose and cannot be used as a base for mounting a fin structure. Those electrical devices include CCD, CMOS IC, some sensing IC, or the like. For example, as shown in FIG. 2, in an electrical device 2a such as a CCD (Charge Coupled Device), a viewing window 21 for an optical purpose is provided on the top surface of the electrical device 2a mounted on a PC board 1. Apparently, for such a type of electrical devices 2a, the dissipating fin structure 3 as shown in FIG. 1 can not be used. However, another solution for heat dissipating is still necessary.

As shown in FIG. 2, the top surface of the electrical device 2a is not suitable for establishing a fin structure. Therefore, an upper dissipating plate 4 made of conductive material and mounted between the electrical device 2a and the PC board 1 is generally utilized to diffuse the generated heat. Of course, respective lead slots 41 are needed on the dissipating plate 4 for allowing the leads 23 of the electrical device 2a to pass through.

From the aforesaid description, it is obvious that the conventional heat dissipating structure, such as the fin structure, is not applicable to the electrical device whose top surface can not be provided as a mounting base. Though the upper dissipating plate 4 can enhance the heat dissipation efficiency to some extent, the accommodation space on a PC board 1 is generally limited for installing an large dissipating plate 4 that is capable of great heat diffusion. Besides, the heat dissipated from the edge of the upper dissipating plate 4 will inevitably affect other adjacent electrical devices. Moreover, since the dissipating plate 4 is sandwiched by the electrical device 2a and the PC board 1, the heat dissipating performance of the dissipating plate 4 can not be good.

SUMMARY OF THE INVENTION

Accordingly, it is an object of the present invention to provide a heat dissipating structure for an electrical device, which can improve the heat dissipation efficiency for the electrical device by providing a dissipating opening on the PC board and under the electrical device.

It is another object of the present invention to provide a heat dissipating structure for an electrical device. The heat dissipating structure comprises an upper dissipating plate sandwiched between the electrical device and the PC board, and a dissipating opening provided on the PC board under the electrical device. It is a further object of the present invention to provide a heat-dissipating structure for an electrical device. The heat dissipating structure directs the generated heat of the electrical device to the other side of the PC board by a lower dissipating plate with a connection portion passing through a dissipating opening of the PC board contacting with the electrical device. The connection portion contacts with the bottom surface of the electrical device and conducts the heat to the lower dissipating plate.

It is another object of the present invention to provide a heat-dissipating structure for an electrical device, which provides an upper dissipating plate sandwiched between the electrical device and the PC board, a dissipating opening provided at the PC board and located substantially under the electrical device, and a lower dissipating plate located under the PC board having a connecting portion passing through the dissipating opening to the upper dissipating plate. The whole structure integrally establishes an effective heat dissipating path for the electrical device.

The heat-dissipating structure for an electrical device in accordance with the present invention is utilized to dissipate the heat generated by the electrical device mounted on a PC board. The PC board with a substantial thickness includes an upper surface, and a lower surface located opposite to the upper surface. The electrical device has a plurality of leads extruding from the bottom surface thereof to anchor the electrical device onto the PC board and electrically connect the electrical device with the other circuits on the PC board. The present invention is characterized in that a dissipating opening is provided on the PC board, and is positioned substantially under the electrical device. Thereby, the heat generated by the electrical device can be dissipated through the dissipating opening via air media.

In one embodiment of the present invention, the dissipating structure further includes an upper dissipating plate to diffuse the heat. The upper dissipating plate is sandwiched between the bottom surface of the electrical device and the upper surface of the PC board, and lies over the dissipating opening. Preferably, the dissipating plate is broader than the electrical device for effectively diffusing the heat away from the electrical device. The dissipating plate further has lead slots for the respective leads of the electrical device to pass through.

In one embodiment of the present invention, the upper dissipating plate further includes at least one dissipating slot for increasing the area of the plate to contact with the atmosphere.

In one embodiment of the present invention, the heat-dissipating structure further includes a lower dissipating plate located under the lower surface of the PC board with a substantial spacing in between. In order to conduct the generated heat downward to the lower dissipating plate, the lower dissipating plate has a connecting portion passing through the dissipating opening of the PC board to contact with the bottom surface of the electrical device at one end thereof.

In one embodiment of the present invention, the heat-dissipating structure can have both the upper dissipating plate and the lower dissipating plate. Also, a connecting arm is provided to connect the upper dissipating plate with the lower one.

DESCRIPTION OF THE PREFERRED EMBODIMENT

The invention disclosed herein relates to a heat-dissipating structure for an electrical device. In the following description, numerous details are set forth in order to provide a thorough understanding of the present invention. It will be appreciated by one skilled in the art that variations of these specific details are possible while still achieving the results of the present invention. In other instances, well-known components are not described in detail in order not to unnecessarily obscure the present invention.

Figure 1:
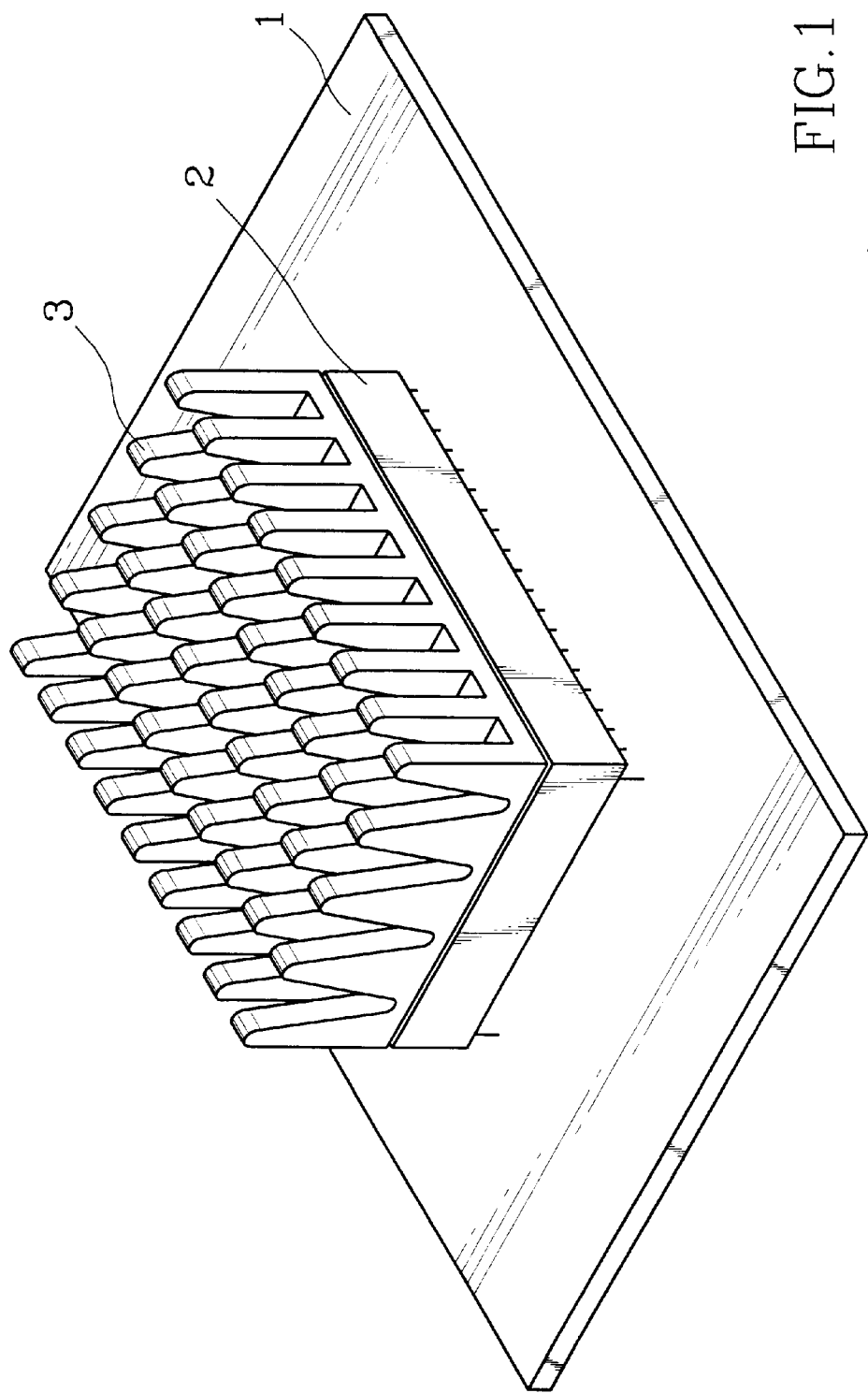
FIG. 1 is a perspective view of a conventional heat-dissipating structure for an electrical device.
Figure 2:
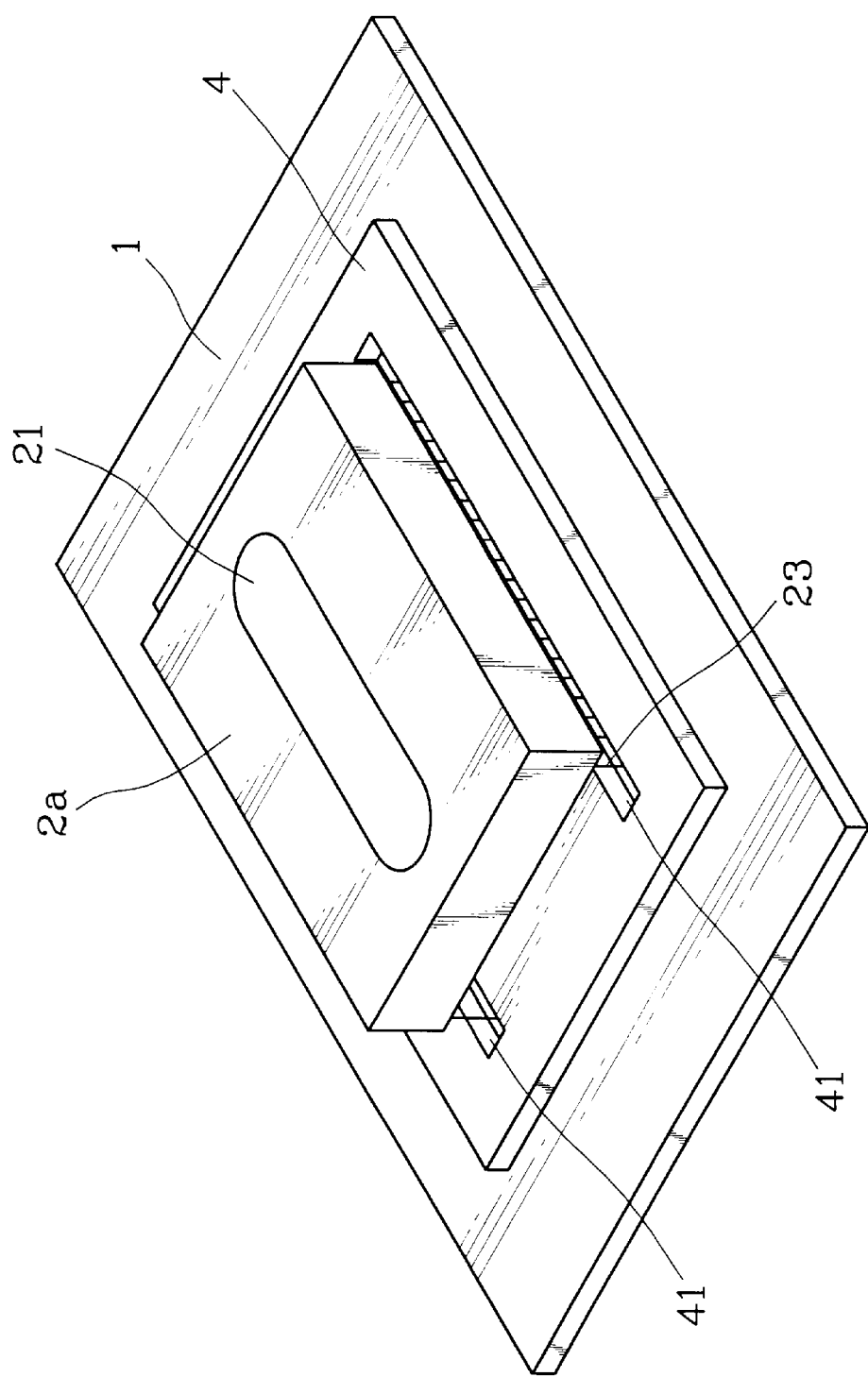
FIG. 2 is a perspective view of another heat-dissipating structure for an electrical device with a viewing window.
Figure 3:
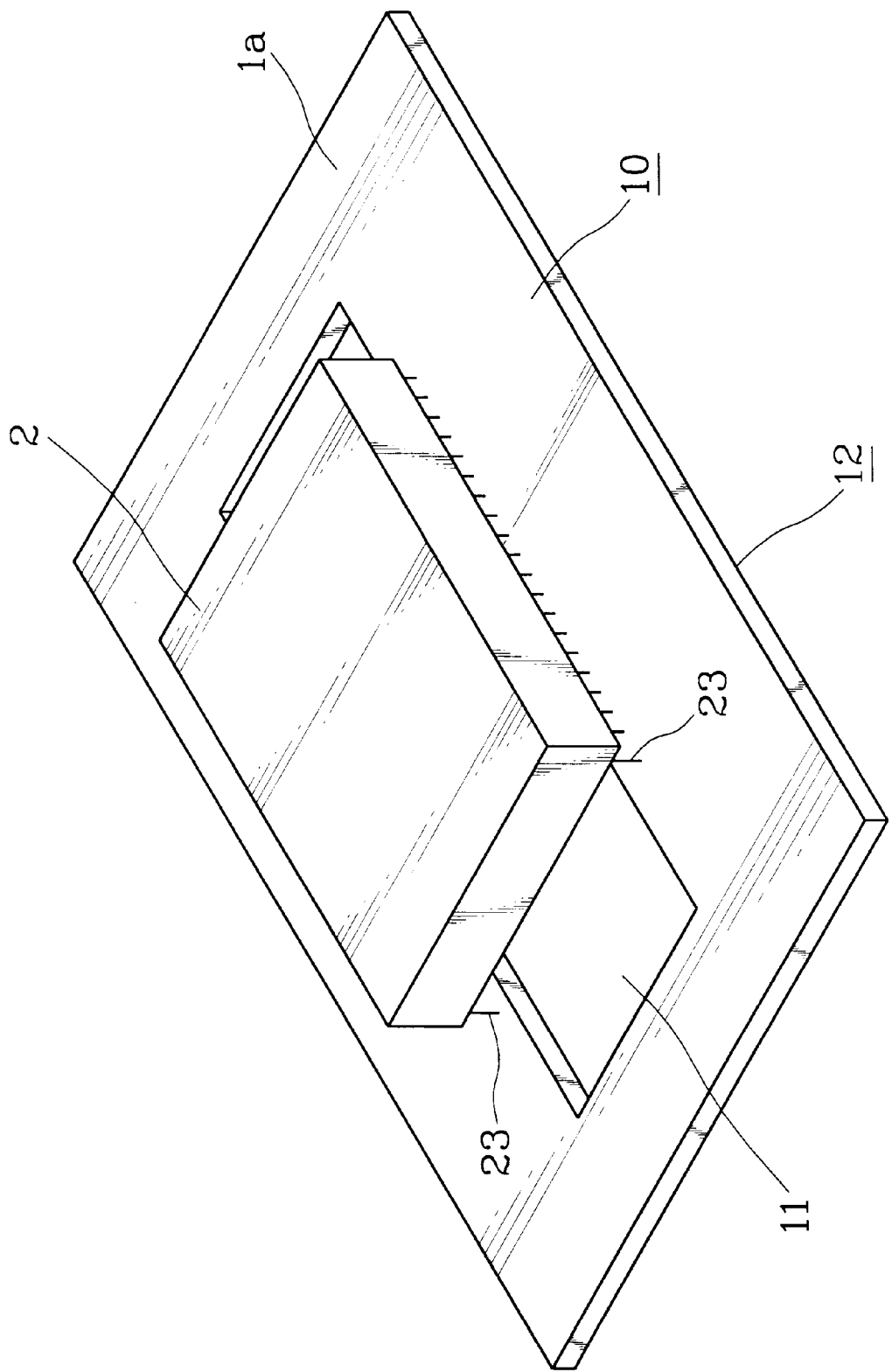
FIG. 3 is a perspective view of the first embodiment of the heat-dissipating structure for an electrical device in accordance with the present invention.

Please refer to FIG. 3, which is the first embodiment of the present invention. In this embodiment, the PC board 1a with a substantial thickness includes an upper surface 10, and a lower surface 12 located opposite to the upper surface 10. The electrical device 2 is anchored and electrically connected to the upper surface 10 of the PC board 1a via a plurality of leads 23 extending downward from the bottom of the electrical device 2. The heat-dissipating structure of the present invention is featured by that the PC board 1a comprises a dissipating opening 11 located substantially under the electrical device 2. The dissipating opening 11 can be a square, an ellipse, any other shapes, or a plurality of slots which do not prevent the electrical device 2 from anchoring and electrically connecting to the PC board 1a.

As shown in FIG. 3, the first embodiment of the present invention, the heat dissipating structure provides a dissipating opening 11 to facilitate the heat dissipation by air convection under the electrical device 2.

Figure 4:
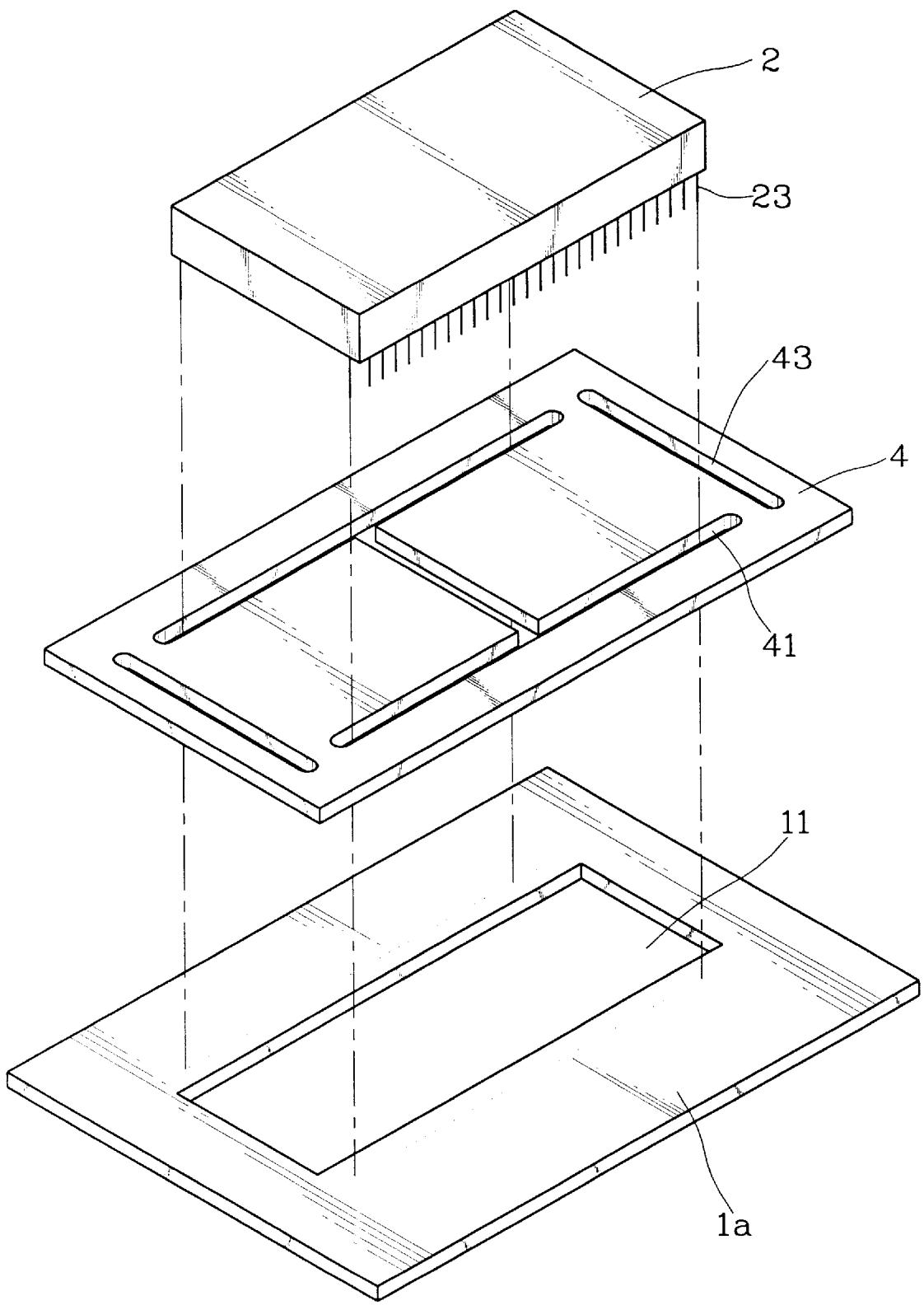
FIG. 4 is an exploded view of the second embodiment of the heat-dissipating structure for an electrical device in accordance with the present invention.

Please refer to FIG. 4, which is the second embodiment of the present invention. In addition to the dissipating opening 11, the second embodiment further comprises an upper dissipating plate 4 sandwiched between the electrical device 2 and the PC board 1a. The dissipating plate 4 is made of conductive material, for example, metal, to improve the heat dissipating efficiency. Preferably, the area of the upper dissipating plate 4 is no less than the bottom area of the electrical device 2. Furthermore, the upper dissipating plate 4 includes respective lead slots 41 thereof for allowing the leads 23 of the electrical device 2 to pass through the lead slots 41 and anchor the electrical device 2 onto the PC board 1a.

It should be noted that for an SMT (surface mount technology) electrical device, the upper dissipating plate 4 does not need to provide lead slots because the leads of an SMT electrical device do not penetrate the PC board. In such an application, the surface area of the upper dissipating plate 4 should be less than the area of the bottom surface of the electrical device 2 so that the leads of the electrical device 2 will not be electrically contacted with the upper dissipating plate 4.

In this embodiment, the leads extend from the bottom of the electrical device 2. But it should also be noted that for some SMT electrical devices, the leads might extend from lateral sides of the devices instead of from the bottom of the devices. This variation shall not affect the implementation of the present invention.

In the second embodiment as shown in FIG. 4, the heat generated by the electrical device 2 is first diffused by the upper dissipating plate 4 and then discharged to the nearby ambience through the exposed surface of the upper dissipating plate 4. Furthermore, to improve the efficiency of the heat dissipation, the upper dissipating plate 4 can include one or more dissipating slots 43 thereof to increase the exposed area of the upper dissipating plate 4 for heat dissipation.

Figure 5:
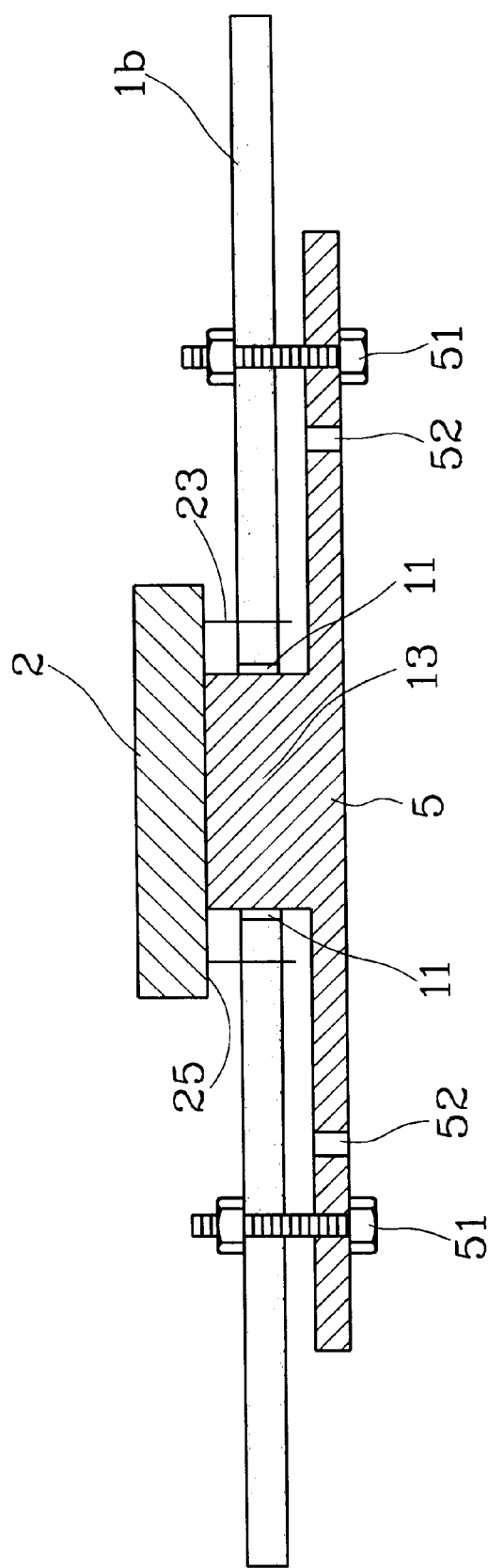
FIG. 5 is a cross sectional view of the third embodiment of the heat-dissipating structure for an electrical device in accordance with the present invention.

Please refer to FIG. 5, which is the third embodiment of the present invention. In addition to the dissipating opening 11, the third embodiment further comprises a lower dissipating plate 5 to diffuse the heat. The lower dissipating plate 5 is made of conductive material, for example, metal, and is located under the PC board 1b. The lower dissipating plate 5 includes a connecting portion 13 protruding upward and passing through the dissipating opening 11 to contact with the bottom surface of the electrical device 2. Preferably, there exists a substantial spacing between the lower dissipating plate 5 and the PC board 1b. The substantial spacing is to increase the exposed area of the lower dissipating plate 5 to the ambience, thus improve the air convection, and thereby enhance the heat dissipating efficiency of the lower dissipating plate 5. The lower dissipating plate 5 is fixed to the PC board 1b by a connecting device. The connecting device can be a screw set 51 as shown in FIG. 5. It should be noted that other kind of connecting device, for example, fasteners, insert part, or the like will also serve the purpose.

In the third embodiment of the present invention as shown in FIG. 5, a portion of the heat generated by the electrical device 2 can be transported downward through the connecting portion 13 and dissipated to the nearby ambience via the heat exchange on the surface of the lower dissipating plate 5, which is located far away from the electrical device 2. To enhance the heat dissipating efficiency, the lower dissipating plate 5 can further include one or more dissipating slots 52 thereof for increasing the available area on the lower dissipating plate 5 for heat dissipation.

Figure 6:
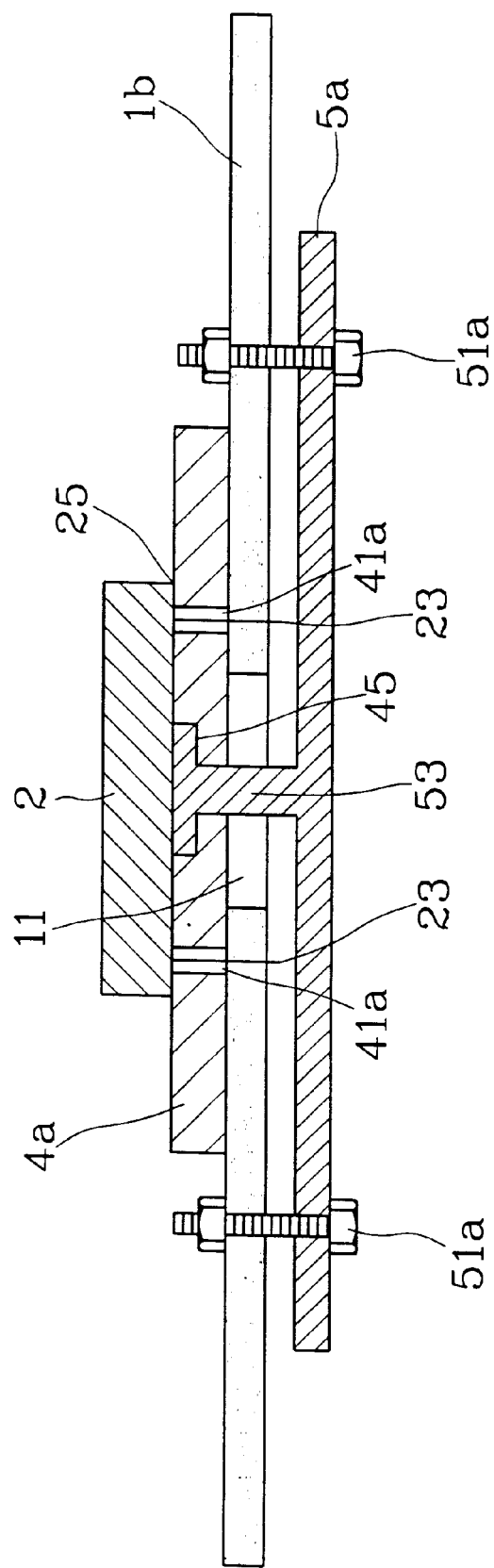
FIG. 6 is a cross sectional view of the fourth embodiment of the heat-dissipating structure for an electrical device in accordance with the present invention.

Please refer to FIG. 6, which is the fourth embodiment of the present invention. In addition to the dissipating opening 11, the fourth embodiment further comprises an upper dissipating plate 4a and a lower dissipating plate 5a to diffuse the heat. The upper dissipating plate 4a is made of conductive material, for example, metal, and is sandwiched between the electrical device 2 and the PC board 1b. The lower dissipating plate 5a is also made of conductive material, for example, metal, and is located under the PC board 1b. The fourth embodiment further comprises a connecting arm 53 made of conductive material for connecting the upper dissipating plate 4a and the lower dissipating plate 5a. There are several different ways for implementing the connecting arm 53, for example, the connecting arm 53 protrudes from the lower dissipating plate 5a, passes through the dissipating opening 11, and anchors to a connecting seat 45 at the upper dissipating plate 4a. By such an arrangement, the heat dissipation can be carried out at the upper dissipating plate 4a, the connecting arm 53, and the lower dissipating plate 5a at the same time.

According to the present invention, the connecting arm 53 is used to connect the lower and the upper dissipating plates 5a and 4a for diffusing part of the heat downward to the lower dissipating plate 5a. As shown in FIG. 6, the connecting arm 53 and the lower dissipating plate Sa are combined as one piece. However, the connecting arm 53 can be embodied as an extending arm of the upper dissipating plate 4a, an isolated connecting arm, or the like.

In the present invention, the lower or upper dissipating plate can further include slots, wave-shape surface, extrusion, or the like to enlarge the available exposed area and thus achieve better heat dissipation performance. Also, to ensure a better performance, the lower dissipating plate, the upper dissipating plate, and the connecting arm could be made of metal or other material with a high heat-conductivity.

While the present invention has been particularly shown and described with reference to preferred embodiments, it will be understood by those skilled in the art that various changes in form and detail may be without departing from the spirit and scope of the present invention. For example, in addition to CCD, CMOS IC and some sensing IC, those skilled in the art can also combine the present invention with the conventional heat dissipation structure to any kind of electrical devices to improve their heat dissipation efficiency.

I claim:

1. A heat-dissipating structure for an electrical device having a plurality of leads extending from a surface thereof, and comprising:

a PC board, including an upper surface, a lower surface located opposite to said upper surface, and a dissipating opening, said leads of said electrical device being connected to said upper surface, and said electrical device being located above said dissipating opening; and an upper dissipating plate located above the dissipating opening and sandwiched between said PC board and said electrical device;

wherein said upper dissipating plate has length and width dimensions greater than length and width dimensions of said dissipating opening and has lead slots therethrough for said leads of said electrical device to pass through.

2. The head-dissipating structure for an electrical device of claim 1, wherein said upper dissipating plate further includes a dissipating slot for providing more exposed surfaces for heat dissipation.

3. The heat-dissipating structure for an electrical device of claim 1, further comprising a lower dissipating plate and a connection arm; said lower dissipating plate being located under said lower surface of said PC board; and said connecting arm passing through said dissipating opening to connect said lower dissipating plate with said upper dissipating plate.

4. The heat-dissipating structure for an electrical device of claim 3, wherein said lower dissipating plate is spaced from said lower surface of said PC board, and said lower dissipating plate is fixed to said PC board by a connecting device.

5. The head-dissipating structure for an electrical device of claim 4, wherein said connecting device is a screw set.

6. The heat-dissipating structure for an electrical device of claim 3, wherein said upper dissipating plate further includes a dissipating slot for providing exposed surfaces for heat dissipation.

7. The heat-dissipating structure for an electrical device of claim 3, wherein said lower dissipating plate further includes a dissipating slot for providing exposed surfaces for heat dissipation.

\* \* \* \* \*